(12) United States Patent
Yaegashi

(10) Patent No.: US 11,467,497 B2
(45) Date of Patent: Oct. 11, 2022

(54) METHOD OF FORMING MASK

(71) Applicant: Tokyo Electron Limited, Tokyo (JP)

(72) Inventor: Hidetami Yaegashi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 421 days.

(21) Appl. No.: 16/542,396

(22) Filed: Aug. 16, 2019

(65) Prior Publication Data

US 2020/0066536 A1 Feb. 27, 2020

(30) Foreign Application Priority Data

Aug. 21, 2018 (JP) .............................. JP2018-155042

(51) Int. Cl.
*G03F 7/09* (2006.01)
*G03F 7/26* (2006.01)
*G03F 7/004* (2006.01)

(52) U.S. Cl.
CPC .............. *G03F 7/26* (2013.01); *G03F 7/0042* (2013.01); *G03F 7/094* (2013.01)

(58) Field of Classification Search
CPC . G03F 7/091; G03F 7/094; G03F 7/26; G03F 7/0045

See application file for complete search history.

(56) References Cited

U.S. PATENT DOCUMENTS

| 2008/0044759 A1* | 2/2008 | Ishibashi ............. H01L 21/3086 430/270.1 |
| 2012/0241411 A1* | 9/2012 | Darling ............... H01L 21/0274 216/67 |
| 2013/0177847 A1* | 7/2013 | Chatterjee ............. G03F 7/0757 430/270.1 |
| 2016/0216609 A1* | 7/2016 | Shiobara ................... G03F 7/32 |

FOREIGN PATENT DOCUMENTS

| JP | 2003-131364 | 5/2003 |
| JP | 2003-195521 | 7/2003 |
| JP | 2006-091888 | 4/2006 |
| JP | 2013-021152 | 1/2013 |

* cited by examiner

*Primary Examiner* — Daborah Chacko-Davis
(74) *Attorney, Agent, or Firm* — IPUSA, PLLC

(57) ABSTRACT

A method of forming a mask includes forming a base film containing a treatment agent on an object, forming a photosensitive organic film on the base film, forming an infiltrated portion by infiltrating the treatment agent into a lower portion of the photosensitive organic film, selectively exposing the photosensitive organic film to form a first region soluble in an alkaline solution and a second region insoluble in the alkaline solution, forming a third region insoluble in the alkaline solution in the infiltrated portion in the first region by causing a reaction between the first region and the treatment agent, developing the photosensitive organic film to remove a fourth region that is in the first region and other than the third region while leaving intact the second region and the third region, and etching the photosensitive organic film to remove one of the second region and the third region.

13 Claims, 11 Drawing Sheets

METHOD OF FORMING MASK

CROSS-REFERENCE TO RELATED APPLICATION

The present application is based upon and claims priority to Japanese Patent Application No. 2018-155042, filed on Aug. 21, 2018, the entire contents of which are incorporated herein by reference.

BACKGROUND OF THE INVENTION

1. Field of the Invention

An aspect of this disclosure relates to a method of forming a mask.

2. Description of the Related Art

Along with an increase in the degree of integration of semiconductor devices, patterns formed on resist masks used in manufacturing the semiconductor devices are becoming more and more fine. On the other hand, as the pattern of the resist mask becomes finer, the pattern becomes more likely to collapse. Japanese Laid-Open Patent Publication No. 2013-21152 discloses a method to suppress the collapse of a pattern. In the disclosed method, an acid generated in a resist as a result of exposure is deactivated so that a residual resist film remains in recesses between protrusions of the resist.

SUMMARY OF THE INVENTION

In an aspect of this disclosure, there is provided a method of forming a mask. The method includes forming a base film containing a treatment agent on an object to be processed, forming a photosensitive organic film on the base film, forming an infiltrated portion by infiltrating the treatment agent into a lower portion of the photosensitive organic film, selectively exposing the photosensitive organic film to form a first region that is soluble in an alkaline solution and a second region that is insoluble in the alkaline solution, forming a third region insoluble in the alkaline solution in the infiltrated portion in the first region by causing a reaction between the first region and the treatment agent, developing the photosensitive organic film using the alkaline solution to remove a fourth region that is in the first region and other than the third region while leaving intact the second region and the third region, and etching the photosensitive organic film to remove one of the second region and the third region while leaving intact another one of the second region and the third region.

DESCRIPTION OF THE PREFERRED EMBODIMENTS

Collapse of a pattern of a resist mask, which tends to occur when the pattern of the resist mask becomes fine, can be reduced by making the resist mask thinner and making the aspect ratio of the remaining pattern smaller. However, if the resist mask is thinned, the accuracy of the pattern tends to be reduced. Particularly, in the case of a line and space (L/S) pattern, the line edge roughness (LER) and the line width roughness (LWR) of the pattern tend to increase.

Here, the reason why the pattern accuracy decreases is described. When forming a resist mask, a photoresist film is formed by applying a photoresist to a base film, and the photoresist film is exposed and developed. In this process, the applied photoresist may react with the base film. If the photoresist reacts with the base film, an altered layer with a thickness of about 10 nm to 30 nm may be formed in a lower portion of the photoresist film as a result of the reaction with the underlaying film, and the altered layer may have properties different from those of a bulk layer on the altered layer. For example, the likelihood that a latent image is formed in the altered layer by exposure is different from that in the bulk layer. Because the exposure is performed based on conditions corresponding to the properties of the bulk layer, a desired latent image may not be formed in the altered layer. When a thick resist mask is to be formed, because the ratio of the altered layer to the bulk layer in the thickness direction is low, the influence of the altered layer on the pattern accuracy is small. However, when a thin resist mask is to be formed, the ratio of the altered layer to the bulk layer in the thickness direction becomes high, and the influence of the altered layer on the pattern accuracy becomes high. For the above reason, if the thickness of a resist mask is reduced, the pattern accuracy tends to decrease.

An aspect of this disclosure provides a method of forming a mask that can improve pattern accuracy.

Embodiments of the present invention are described below with reference to the accompanying drawings. In the specification and the drawings of the present application, the same reference number may be assigned to components having substantially the same function and configuration, and repeated descriptions of such components may be omitted.

First Embodiment

Figure 1:
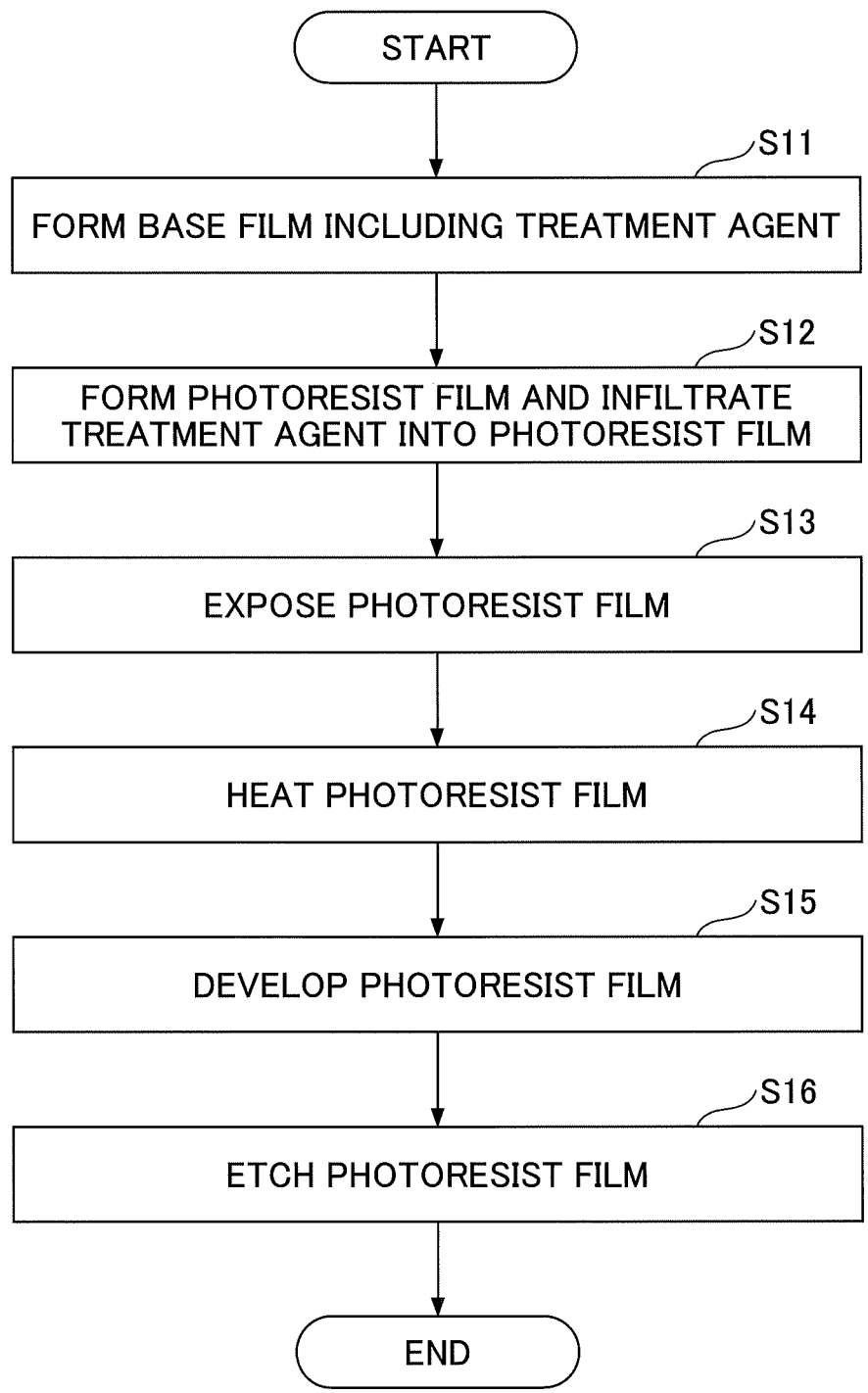
FIG. 1 is a flowchart illustrating a method of forming a mask according to a first embodiment.

First, a first embodiment is described. FIG. 1 is a flowchart illustrating a method of forming a mask according to the first embodiment.

The method of forming a mask according to the first embodiment includes forming a base film containing a treatment agent (step S11), forming a photoresist film and infiltrating the treatment agent into the photoresist film (step S12), and exposing the photoresist film (step S13). The method of forming a mask according to the first embodiment further includes heating the photoresist film (step S14), developing the photoresist film (step S15), and etching the photoresist film (step S16).

Each of the above steps is described in more detail below. FIGS. 2A through 3C are drawings illustrating the method of forming a mask according to the first embodiment. FIGS. 4A through 4D are drawings illustrating changes in the structural formula of a photoresist film according to the first embodiment.

Figure 2A:
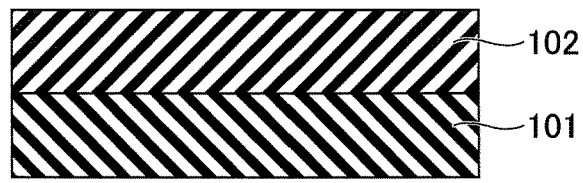
FIGS. 2A through 2C are drawings illustrating the method of forming a mask according to the first embodiment.

At step S11, as illustrated in FIG. 2A, a base film 102 containing a treatment agent is formed on an object 101 to be prosessed. The treatment agent decreases the polarity of a photoresist film at a later step. The base film 102 is, for example, a spin-on carbon (SOC) film, a spin-on glass (SOG) film, or an organic film. The treatment agent is, for example, a metal derivative. In the specification and claims of the present application, examples of metals in the metal derivative include a metalloid such as silicon. The base film 102 containing the treatment agent may be formed by, for example, spin coating (rotary coating) and may have a thickness between 20 nm and 40 nm.

Figure 2B:
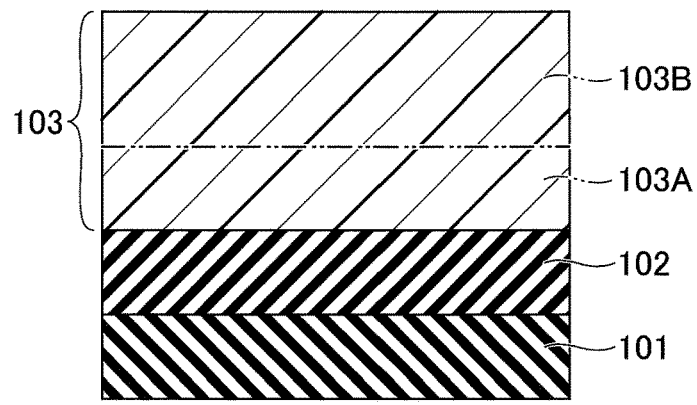

At step S12, as illustrated in FIG. 2B, a photoresist film 103 is formed on the base film 102. In the first embodiment, a positive photoresist film is used as the photoresist film 103. The photoresist film 103 is formed of, for example, a chemically amplified photoresist such as a KrF resist, an ArF resist, or an Extreme Ultraviolet (EUV) resist. The photoresist film 103 includes, for example, a base resin and a photoacid generator (PAG), and the base resin includes a low polarity protecting group as illustrated in FIG. 4A. The protecting group is, for example, a lactone group, an adamantyl group, or both of them. An altered layer may be formed in the photoresist film 103 as a result of reaction with the base film 102. However, the photoresist film 103 is formed to include, on the altered layer, a portion that has not reacted with the base film 102. For example, the photoresist film 103 may be formed by spin coating and may have a thickness between 50 nm and 100 nm. If the thickness of the photoresist film 103 is less than 50 nm, the ratio of the altered layer in the thickness direction may become excessive. Also, if the thickness of the photoresist film 103 is greater than 100 nm, pattern collapse may be more likely to occur. The photoresist film 103 is an example of a photosensitive organic film.

At step S12, in parallel with the formation of the photoresist film 103, a portion of the treatment agent contained in the base film 102 is infiltrated into the photoresist film 103 to form an infiltrated portion 103A in the lower portion of the photoresist film 103. The infiltrated portion 103A is formed to have a thickness of, for example, 10 nm to 40 nm, which is greater than or equal to the thickness of the altered layer. The photoresist film 103 includes a bulk portion 103B on the infiltrated portion 103A.

Figure 2C:
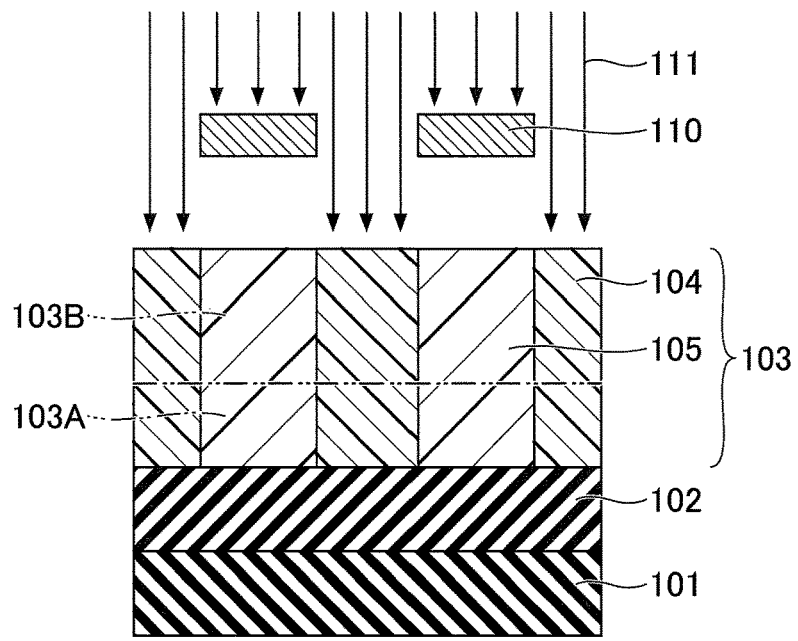

At step S13, as illustrated in FIG. 2C, the photoresist film 103 is selectively exposed using an exposure mask 110. That is, the photoresist film 103 is selectively irradiated with exposure light 111. As a result, exposed regions 104 and unexposed regions 105 are formed in the photoresist film 103 including the infiltrated portion 103A. Because the photoresist film 103 is positive, in the exposed regions 104, the photoacid generator is decomposed and an acid is generated. The light source used for exposure is selected based on the material of the photoresist film 103. For example, a KrF excimer laser (wavelength: 248 nm), an ArF excimer laser (wavelength: 193 nm), or an EUV excimer laser (wavelength: 13.5 nm) may be used. The exposed regions 104 are examples of first regions that are soluble by an alkaline solution, and the unexposed regions 105 are examples of second regions that are insoluble by an alkaline solution.

Even if the photoresist film 103 includes an altered layer, a latent image corresponding to the exposure mask 110 is formed in the bulk portion 103B.

Figure 3A:
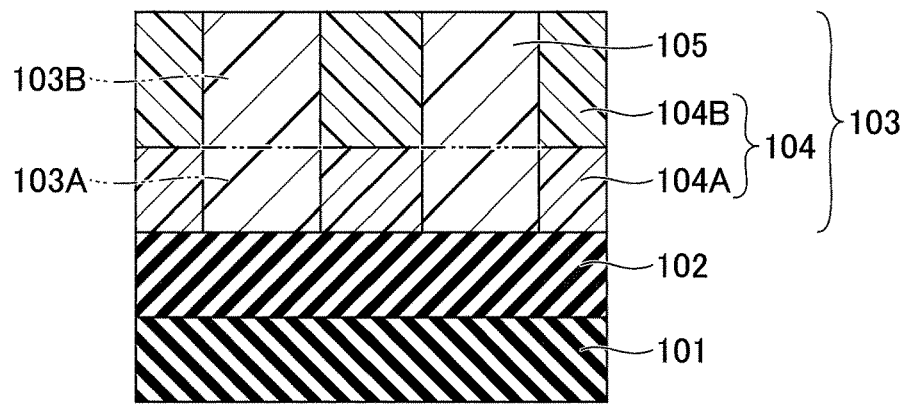
FIGS. 3A through 3C are drawings illustrating the method of forming a mask according to the first embodiment.
Figure 4B:
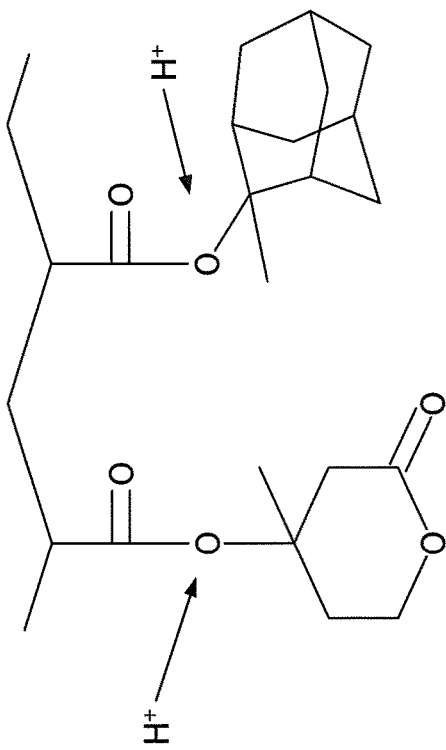
FIGS. 4A through 4D are drawings illustrating changes in the structural formula of a photoresist film according to the first embodiment.
Figure 4D:
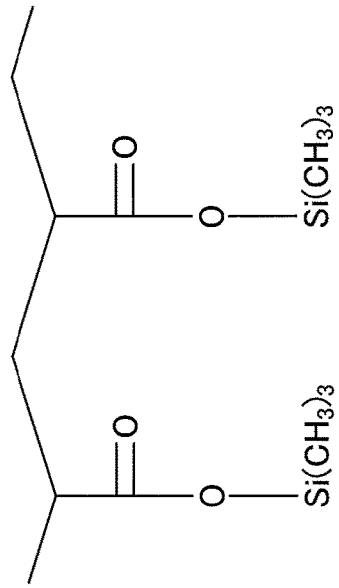
Figure 4A:
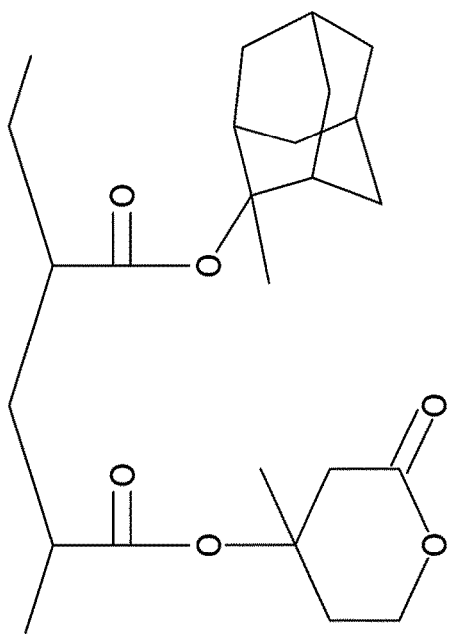
Figure 4C:
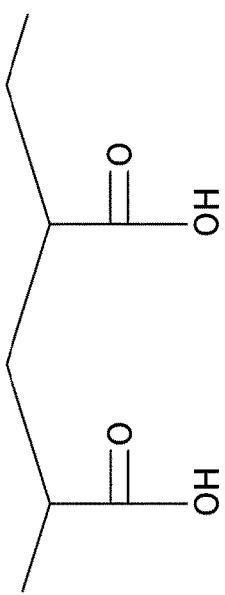

At step S14, the photoresist film 103 is heated to a temperature of, for example, 100° C. to 150° C. to diffuse the acid in the exposed regions 104 as illustrated in FIG. 4B and thereby deprotect the base resin in the photoresist film 103. As a result, in the exposed regions 104, as illustrated in FIG. 4C, the base resin is deprotected and a carboxyl group is formed as illustrated in FIG. 4C, and the polarity of the base resin increases. In the first embodiment, however, the photoresist film 103 includes the infiltrated portion 103A as described above. Therefore, in portions of the exposed regions 104 overlapping the infiltrated portion 103A, the functional group generated as a result of hydrolysis of the treatment agent reacts with the carboxyl group as illustrated in FIG. 4D, and the polarity of the base resin decreases. As a result, as illustrated in FIG. 3A, low polarity regions 104A are formed in the portions of the exposed regions 104 overlapping the infiltrated portion 103A. Also, portions of the exposed regions 104 overlapping the bulk portion 103B become high polarity regions 104B including a carboxyl group. The polarity of the low polarity regions 104A is lower than the polarity of the high polarity regions 104B. The low polarity regions 104A are examples of third regions, and the high polarity regions 104B are examples of fourth regions. FIG. 4D is a structural formula of the low polarity regions 104A in a case where the base film 102 includes alkoxysilane as the treatment agent. Thus, the structural formula of the unexposed regions 105 is represented by FIG. 4A, the structural formula of the low polarity regions 104A is represented by FIG. 4D, and the structural formula of the high polarity regions 104B is represented by FIG. 4C. The heating of the photoresist film 103 may be performed also for the purpose of post-exposure bake (PEB).

Figure 3B:
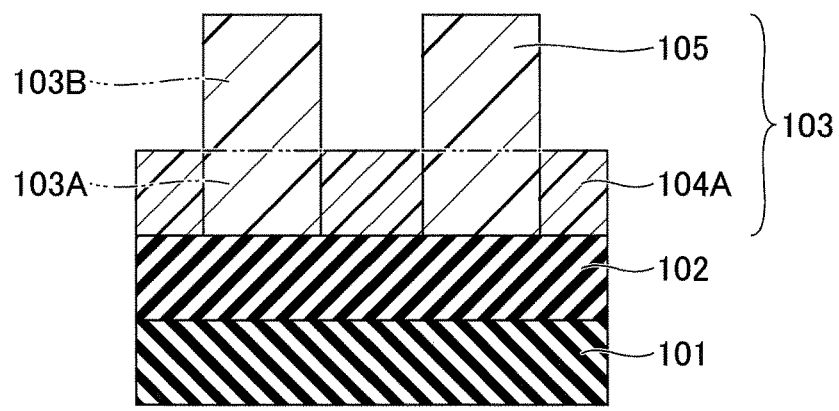

At step S15, the photoresist film 103 is developed. For the development, a high-polarity alkaline solution such as tetramethylammonium hydroxide (TMAH) is used as a developer. As a result of the development, as illustrated in FIG. 3B, the high polarity regions 104B are removed while leaving intact the unexposed regions 105 and the low polarity regions 104A. At least the pattern formed by the portions of the unexposed regions 105 overlapping the bulk portion 103B accurately reflects the pattern formed by light shielding portions of the exposure mask 110. Also, because the unexposed regions 105 are supported by the low polarity regions 104A remaining around the unexposed regions 105, the unexposed regions 105 are unlikely to collapse even if the unexposed regions 105 are thick.

Figure 3C:
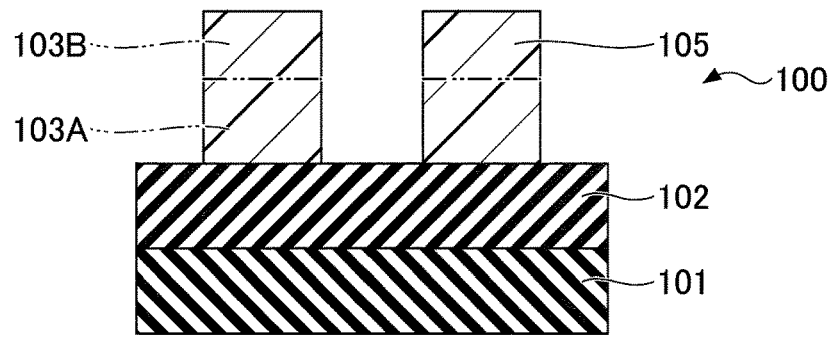

At step S16, the low polarity regions 104A are removed as illustrated in FIG. 3C by performing dry etching such as reactive ion etching (RIE) on the photoresist film 103. At this step, the thickness of the unexposed regions 105 may be reduced. As a result, a mask 100 having openings in areas where the low polarity regions 104A were present is obtained. Because the low polarity regions 104A are etched using the portions of the unexposed regions 105 overlapping the bulk portion 103B as a mask, the pattern of the openings of the mask 100 also becomes accurate.

Thus, the first embodiment makes it possible to form the mask 100 by accurately transferring the pattern of the exposure mask 110.

For example, when an L/S pattern is to be formed, the first embodiment makes it possible to reduce LER and LWR.

Also, the first embodiment makes it possible to suppress defective openings (missing) in a fine hole pattern and suppress fine hole patterns from being joined (kissing). Further, the first embodiment makes it possible to suppress fine line patterns from being joined (bridging) and suppress a fine line pattern from being broken (necking). These effects are particularly prominent when a mask with a fine pattern is formed using EUV as exposure light. In the related-art technologies, in general, when a mask with a fine pattern is formed using EUV, the thickness of a photoresist film is decreased to suppress the pattern collapse due to the high aspect ratio of the pattern. However, decreasing the thickness of the photoresist film results in an increase in the percentage of the altered layer in the photoresist film and increases LER and LWR. On the other hand, with the method of the present embodiment, even if a thick photoresist film 103 is formed to form a mask with a fine pattern using EUV, the unexposed regions 105 are supported by the low polarity regions 104A and do not readily collapse. Accordingly, the present embodiment is not susceptible to the influence of the altered layer and is extremely effective in forming a mask with a fine pattern using EUV.

At step S16, the dry etching of the photoresist film 103 may be performed such that the etching rate of the low polarity regions 104A becomes higher than the etching rate of the unexposed regions 105. For example, when an SOC film containing alkoxysilane is used as the base film 102, the etching rate of the low polarity regions 104A can be made higher than the etching rate of the unexposed regions 105 by using a fluorocarbon gas such as a $CF_4$ gas as the etching gas.

Second Embodiment

Figure 5:
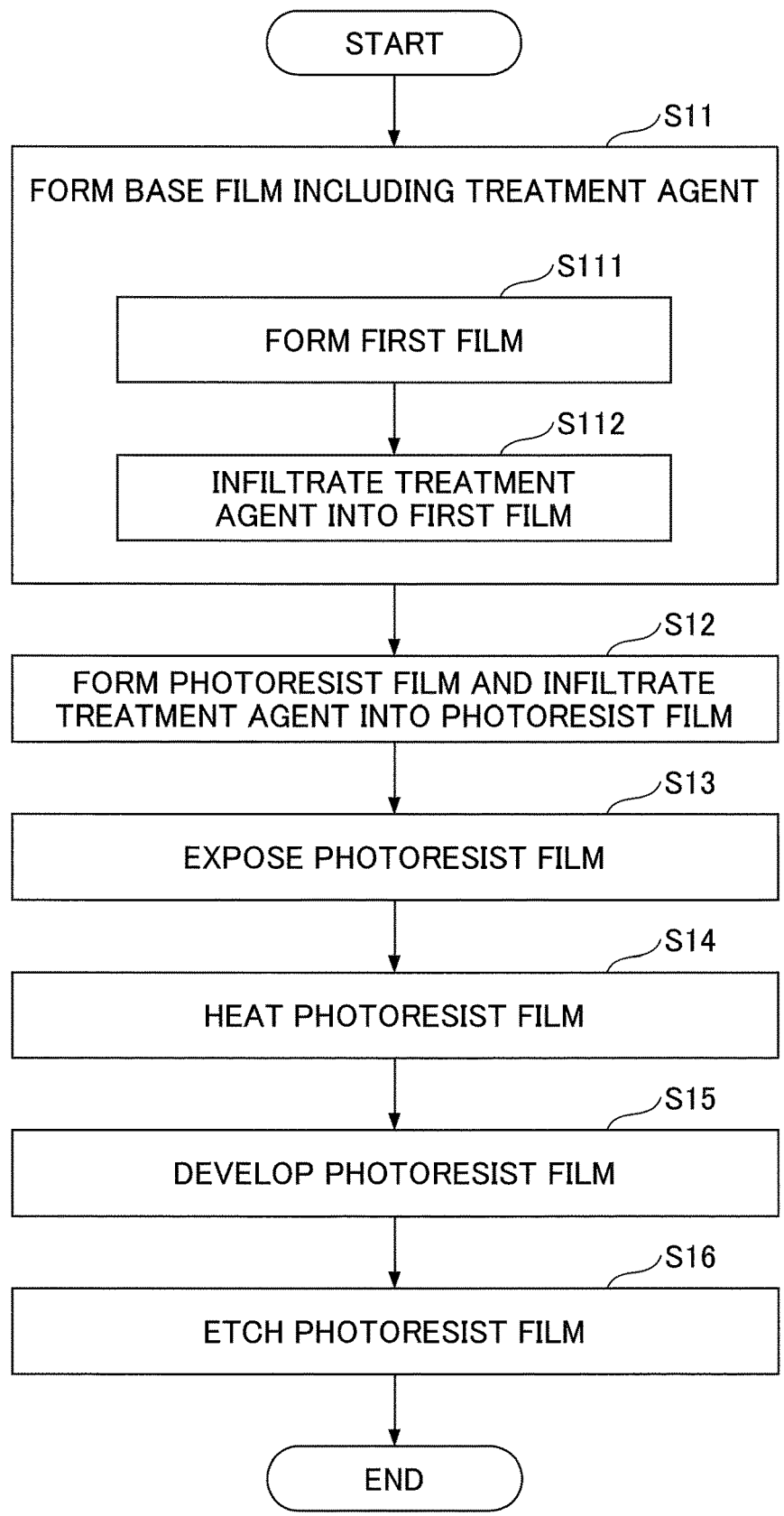
FIG. 5 is a flowchart illustrating a method of forming a mask according to a second embodiment.

Next, a second embodiment is described. The second embodiment differs from the first embodiment in the method of forming a base film containing a treatment agent. FIG. 5 is a flowchart illustrating a method of forming a mask according to the second embodiment.

A method of forming a mask according to the second embodiment includes forming a base film containing a treatment agent (step S11), forming a photoresist film and infiltrating the treatment agent into the photoresist film (step S12), and exposing the photoresist film (step S13). The method of forming a mask according to the second embodiment further includes heating the photoresist film (step S14), developing the photoresist film (step S15), and etching the photoresist film (step S16). Step S11 includes forming a first film (step S111) and infiltrating the treatment agent into the first film (step S112). Steps S12 through S16 are substantially the same as those of the first embodiment.

Figure 6A:
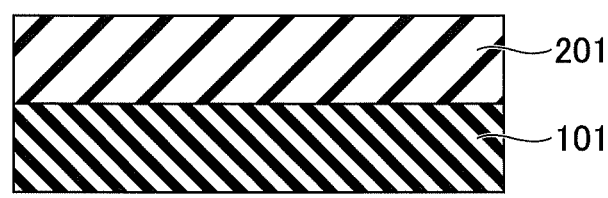
FIGS. 6A and 6B are drawings illustrating the method of forming a mask according to the second embodiment.
Figure 6B:
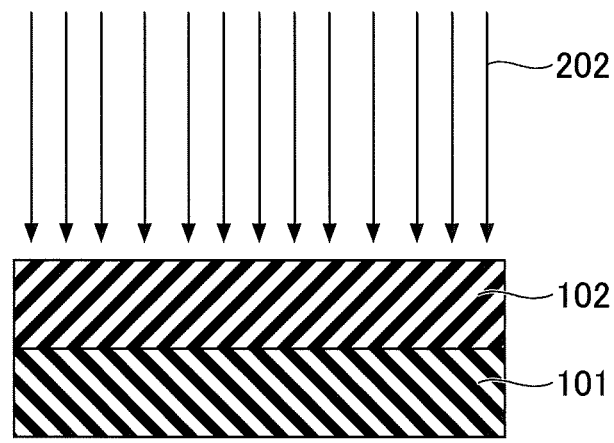

Step S11, according to the second embodiment is described in detail. FIGS. 6A and 6B are drawings illustrating the method of forming a mask according to the second embodiment.

At step S111, as illustrated in FIG. 6A, a first film 201 is formed on the object 101. The first film 201 is, for example, an SOC film, an SOG film, or an organic film. The first film 201 may be formed by, for example, spin coating, and may have a thickness between 20 nm and 40 nm.

At step S112, as illustrated in FIG. 6B, the base film 102 containing the treatment agent is formed by infiltrating a treatment agent 202 into the first film 201. For example, the treatment agent may be infiltrated into the first film in the form of gas. When the treatment agent is infiltrated into the first film 201, for example, the temperature (substrate temperature) of the first film 201 is set at a value between 100° C. and 200° C., and the pressure in the chamber is set at a value between 500 Pa and 2000 Pa. The pressure in the chamber may be set at the atmospheric pressure.

Thereafter, similarly to the first embodiment, steps S12 through S16 are performed.

The second embodiment can also provide advantageous effects similar to those provided by the first embodiment.

Third Embodiment

Figure 7:
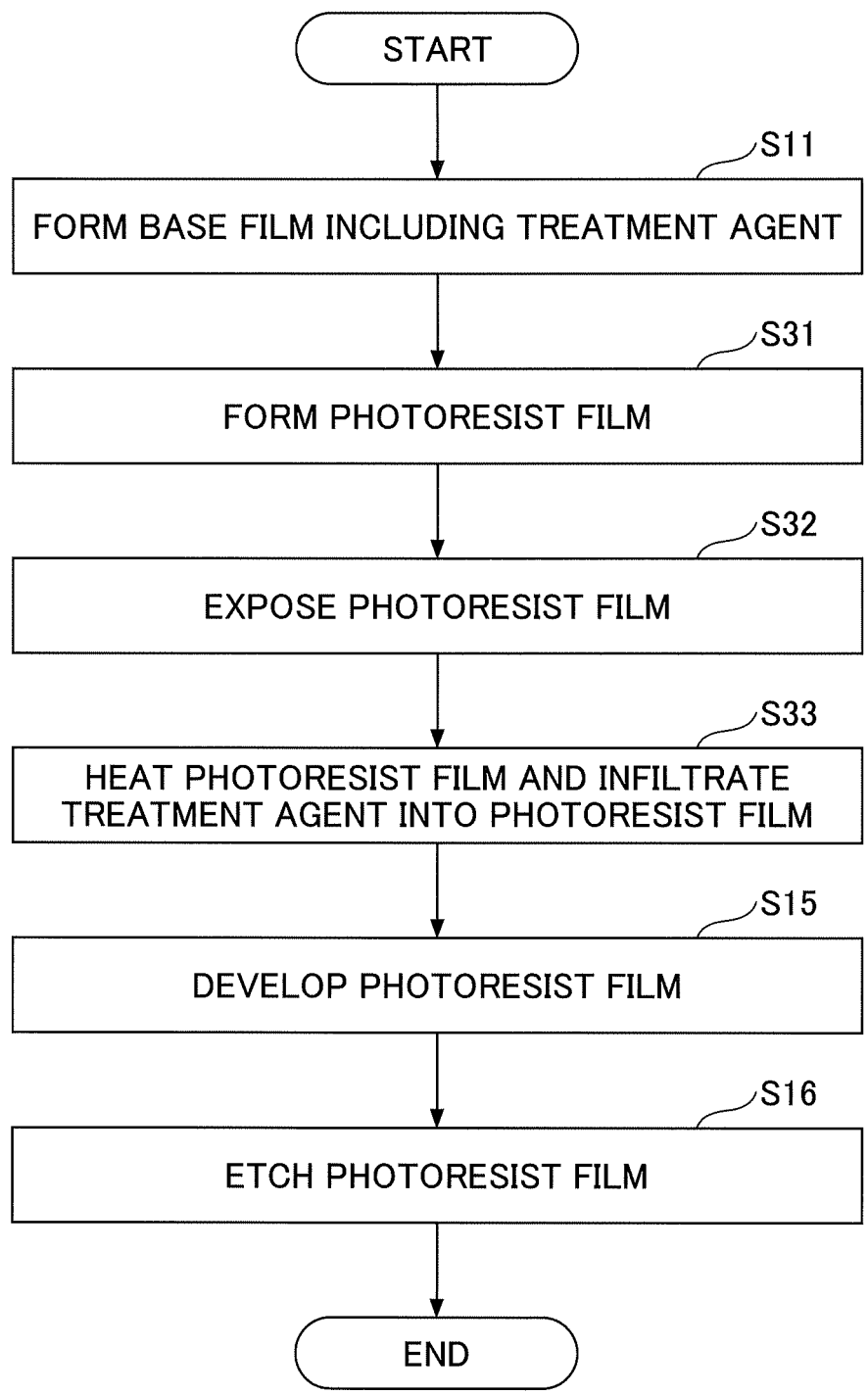
FIG. 7 is a flowchart illustrating a method of forming a mask according to a third embodiment.

Next, a third embodiment is described. The third embodiment differs from the first embodiment in the timing at which the treatment agent is infiltrated into the photoresist film. FIG. 7 is a flowchart illustrating a method of forming a mask according to the third embodiment.

The method of forming a mask according to the third embodiment includes forming a base film containing a treatment agent (step S11), forming a photoresist film (step S31), and exposing the photoresist film (step S32). The method of forming a mask according to the third embodiment further includes heating the photoresist film and infiltrating the treatment agent into the photoresist film (step S33), developing the photoresist film (step S15), and etching the photoresist film (step S16).

FIGS. 8A through 9C are drawings illustrating the method of forming a mask according to the third embodiment.

Figure 8A:
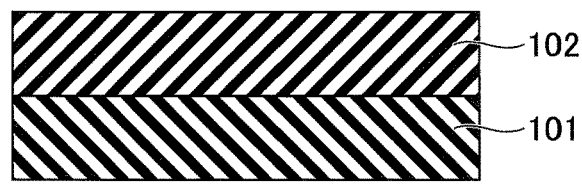
FIGS. 8A through 8C are drawings illustrating the method of forming a mask according to the third embodiment.

At step S11 illustrated in FIG. 8A, similarly to the first embodiment, a base film 102 containing a treatment agent is formed. The treatment agent decreases the polarity of a photoresist film at a later step.

Figure 8B:
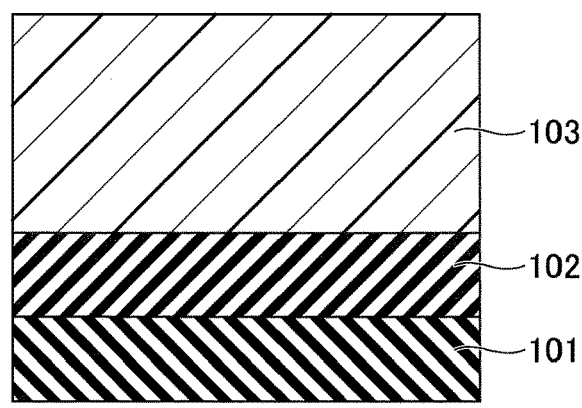

At step S31, as illustrated in FIG. 8B, a photoresist film 103 is formed on the base film 102. An altered layer may be formed in the photoresist film 103 as a result of reaction with the base film 102. However, the photoresist film 103 is formed to include, on the altered layer, a portion that has not reacted with the base film 102. For example, the photoresist film 103 may be formed by spin coating and may have a thickness between 50 nm and 100 nm. In the third embodiment, unlike the first embodiment, the treatment agent contained in the base film 102 is retained in the base film 102. Still, however, a portion of the treatment agent may inevitably infiltrate into the photoresist film 103.

Figure 8C:
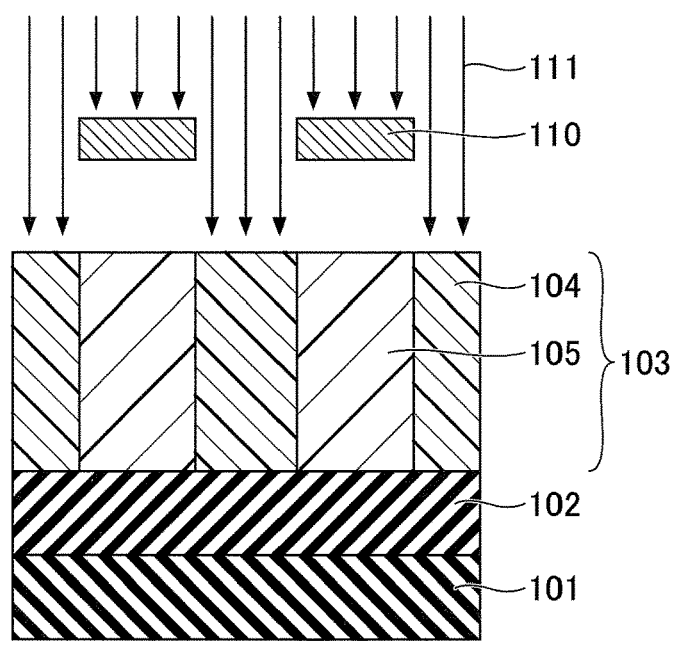

At step S32 illustrated in FIG. 8C, similarly to the first embodiment, the photoresist film 103 is selectively exposed using the exposure mask 110. That is, the photoresist film 103 is selectively irradiated with the exposure light 111. As a result, exposed regions 104 and unexposed regions 105 are formed in the photoresist film 103. Because the photoresist film 103 is positive, in the exposed regions 104, a photoacid generator is decomposed, and an acid is generated.

Even if the photoresist film 103 includes an altered layer, a latent image corresponding to the exposure mask 110 is formed above the altered layer.

Figure 9A:
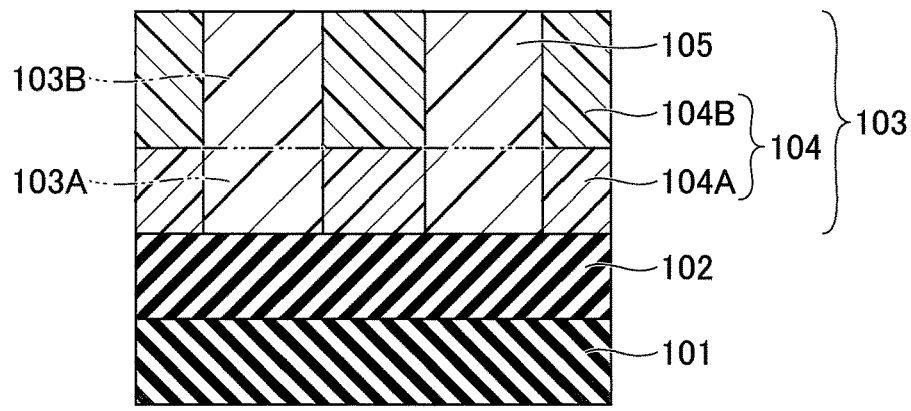
FIGS. 9A through 9C are drawings illustrating the method of forming a mask according to the third embodiment.

At step S33, similarly to the first embodiment, the photoresist film 103 is heated to a temperature of, for example, 100° C. to 150° C. to diffuse the acid in the exposed regions 104 and thereby deprotect the photoresist film 103. Also at step S33, in parallel with the deprotection of the photoresist film 103, a portion of the treatment agent contained in the base film 102 is infiltrated into the photoresist film 103, and an infiltrated portion 103A is formed in the lower portion of the photoresist film 103. The thickness of the infiltrated portion 103A is greater than the thickness of the altered layer and may be, for example, between 20 nm and 40 nm. The photoresist film 103 includes a bulk portion 103B on the infiltrated portion 103A. As a result of the deprotection, in the exposed regions 104, the base resin is deprotected to generate a carboxyl group, and the polarity of the base resin increases. In the third embodiment, however, the infiltrated portion 103A is formed in parallel with the deprotection as described above. Therefore, in portions of the exposed regions 104 overlapping the infiltrated portion 103A, a functional group generated as a result of hydrolysis of the treatment agent reacts with the carboxyl group, and the polarity of the base resin decreases. As a result, as illustrated in FIG. 9A, low polarity regions 104A are formed in portions of the exposed regions 104 overlapping the infiltrated portion 103A, and portions of the exposed regions 104 overlapping the bulk portion 103B become high polarity regions 104B including a carboxyl group.

Figure 9B:
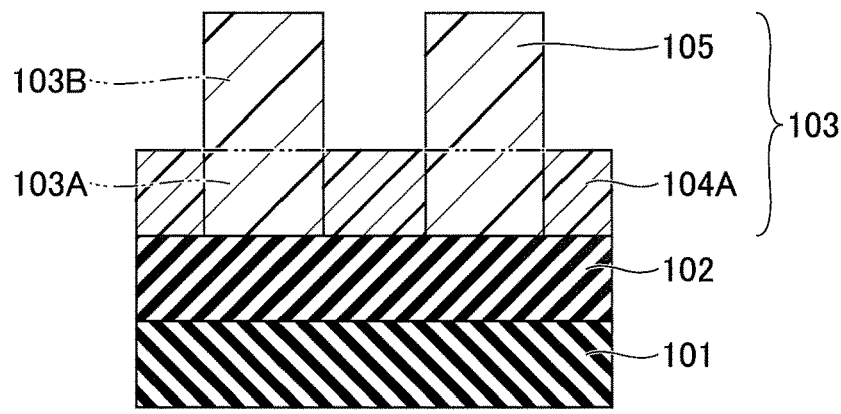

At step S15, similarly to the first embodiment, the photoresist film 103 is developed. As a result, as illustrated in FIG. 9B, the high polarity regions 104B are removed while leaving intact the unexposed regions 105 and the low polarity regions 104A. At least the pattern of portions of the unexposed regions 105 overlapping the bulk portion 103B accurately reflects the pattern formed by light shielding portions of the exposure mask 110. Also, because the unexposed regions 105 are supported by the low polarity regions 104A remaining around the unexposed regions 105, the unexposed regions 105 are unlikely to collapse even if the unexposed regions 105 are thick.

Figure 9C:
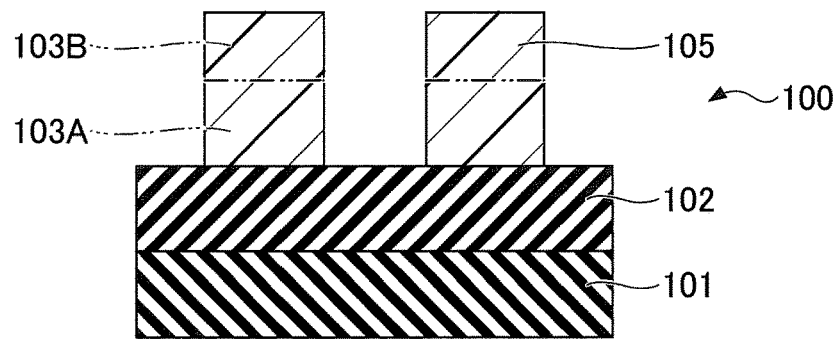

At step S16, similarly to the first embodiment, the low polarity regions 104A are removed as illustrated in FIG. 9C by performing dry etching on the photoresist film 103. At this step, the thickness of the unexposed regions 105 may be reduced. As a result, a mask 100 having openings in areas where the low polarity regions 104A were present is obtained. Because the low polarity regions 104A are etched using the portions of the unexposed regions 105 overlapping the bulk portion 103B as a mask, the pattern of the openings of the mask 100 also becomes accurate.

The third embodiment can also provide advantageous effects similar to those provided by the first embodiment.

Similarly to the second embodiment, step S11 of the third embodiment may include step S111 of forming the first film and step S112 of infiltrating the treatment agent into the first film.

First Variation of Third Embodiment

Figure 10A:
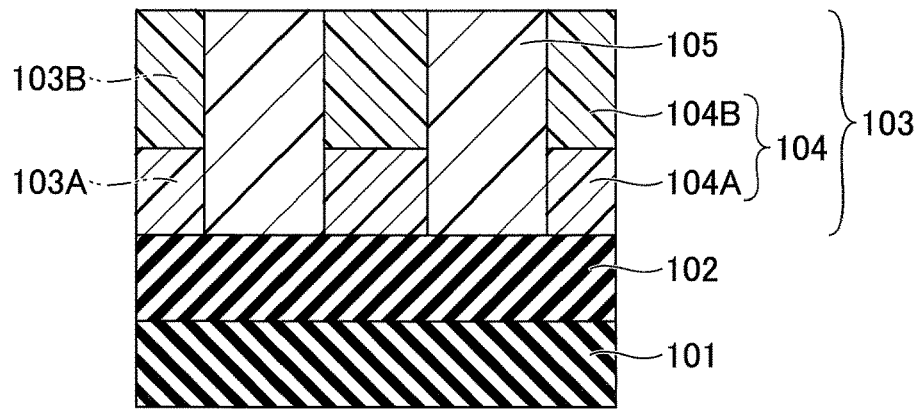
FIGS. 10A through 10C are drawings illustrating a method of forming a mask according to a first variation of the third embodiment.
Figure 10B:
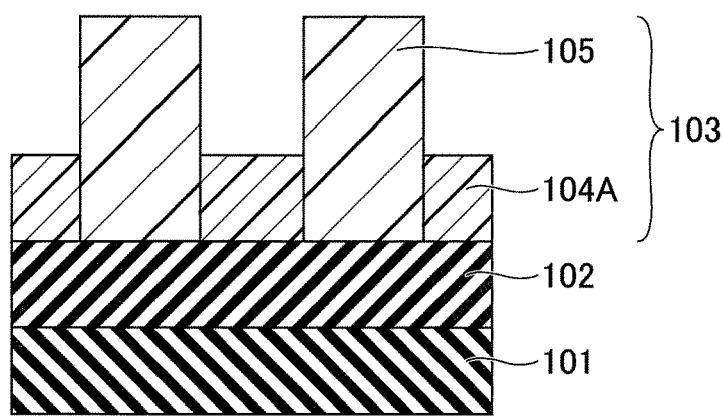
Figure 10C:
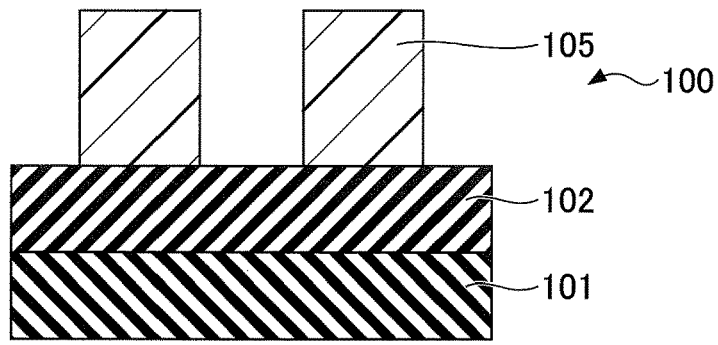

Next, a first variation of the third embodiment is described. The first variation differs from the third embodiment in the area where the infiltrated portion 103A is formed. FIGS. 10A through 10C are drawings illustrating a method of forming a mask according to the first variation of the third embodiment.

In the first variation, steps S11, S31, and S32 are performed in substantially the same manner as in the third embodiment (see FIGS. 7 and 8). That is, steps up to the exposure of the photoresist film 103 are performed. An altered layer may be formed in the photoresist film 103 as a result of reaction with the base film 102. However, the photoresist film 103 is formed to include, on the altered layer, a portion that has not reacted with the base film 102. Also, even if the photoresist film 103 includes an altered layer, a latent image corresponding to the exposure mask 110 is formed by exposure above the altered layer.

At step S33, in parallel with the deprotection of the photoresist film 103, a portion of the treatment agent contained in the base film 102 is infiltrated into the exposed regions 104 of the photoresist film 103 to form the infiltrated portion 103A in the lower portion of the photoresist film 103. That is, while the infiltrated portion 103A is formed also in the unexposed regions 105 in the third embodiment, the infiltrated portion 103A is formed only in the exposed regions 104 in the first variation. Even in this case, a portion of the treatment agent may inevitably infiltrate into the unexposed regions 105. As a result of the deprotection, in the exposed regions 104, the base resin is deprotected, a carboxyl group is generated, and the polarity of the base resin increases. However, similarly to the third embodiment, in portions of the exposed regions 104 overlapping the infiltrated portion 103A, the functional group generated as a result of hydrolysis of the treatment agent reacts with the carboxyl group, and the polarity of the base resin is reduced. As a result, as illustrated in FIG. 10A, the low polarity regions 104A are formed in portions of the exposed regions 104 overlapping the infiltrated portion 103A, and portions of the exposed regions 104 overlapping the bulk portion 103B become the high polarity regions 104B including a carboxyl group.

Next, at step S15, similarly to the third embodiment, the photoresist film 103 is developed. As a result, as illustrated in FIG. 10B, the high polarity regions 104B are removed while leaving intact the unexposed regions 105 and the low polarity regions 104A. At least the pattern formed by portions of the unexposed regions 105 located higher than the low polarity regions 104A accurately reflects the pattern of light shielding portions of the exposure mask 110. Also, because the unexposed regions 105 are supported by the low polarity regions 104A remaining around the unexposed regions 105, the unexposed regions 105 are unlikely to collapse even if the unexposed regions 105 are thick.

At step S16, similarly to the third embodiment, the low polarity regions 104A are removed as illustrated in FIG. 10C by performing dry etching on the photoresist film 103. At this step, the thickness of the unexposed regions 105 may be reduced. As a result, a mask 100 having openings in areas where the low polarity regions 104A were present is obtained. Because the low polarity regions 104A are etched using the portions of the unexposed regions 105 located higher than the low polarity regions 104A as a mask, the pattern of the openings of the mask 100 also becomes accurate.

The first variation can also provide advantageous effects similar to those provided by the third embodiment.

Second Variation of Third Embodiment

Figure 11A:
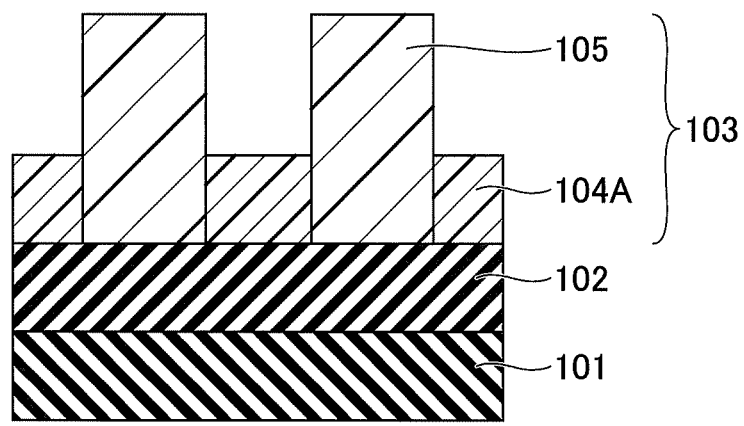
FIGS. 11A and 11B are drawings illustrating a method of forming a mask according to a second variation of the third embodiment.
Figure 11B:
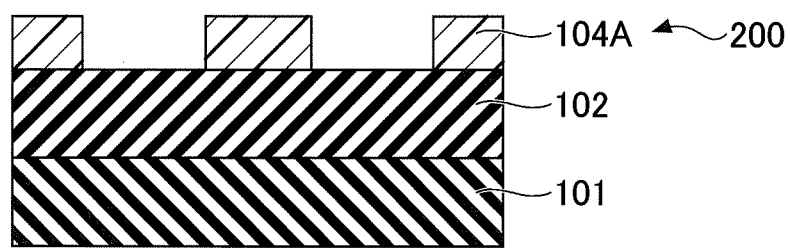

Next, a second variation of the third embodiment is described. The second variation differs from the first variation in the object on which dry etching is performed. FIGS. 11A and 11B are drawings illustrating a method of forming a mask according to the second variation of the third embodiment.

In the second variation, as illustrated in FIG. 11A, steps S11, S31, S32, S33, and S15 similar to those in the first variation are performed. That is, steps up to the development of the photoresist film 103 are performed. At least the pattern formed by portions of the unexposed regions 105 located higher than the low polarity regions 104A accurately reflects the pattern of light shielding portions of the exposure mask 110. Also, because the unexposed regions 105 are supported by the low polarity regions 104A remaining around the unexposed regions 105, the unexposed regions 105 are unlikely to collapse even if the unexposed regions 105 are thick.

At step S16, the unexposed regions 105 are removed as illustrated in FIG. 11B by performing dry etching on the photoresist film 103 such that the etching rate of the unexposed regions 105 becomes higher than the etching rate of the low polarity regions 104A. In this step, the thickness of the low polarity regions 104A may be reduced. As a result, a mask 200 having openings in the areas where the unexposed regions 105 were present is obtained. Because at least the pattern formed by portions of the unexposed regions 105 located higher than the low polarity regions 104A accurately reflects the pattern of light shielding portions of the exposure mask 110, the pattern of the openings of the mask 200 becomes also accurate.

For example, when an SOC film containing alkoxysilane is used as the base film 102, the etching rate of the unexposed regions 105 can be made higher than the etching rate of the low polarity regions 104A by using an oxygen ($O_2$) gas as the etching gas.

The material of the photosensitive organic film is not limited to any specific material, and a negative photoresist film may be used as the photosensitive organic film. Also, for example, polyhydroxystyrene (PHS) having a hydroxyl group protected by a protecting group may be used as the base resin of the photosensitive organic film.

As the treatment agent, any material that hydrolyzes in a photosensitive organic film, reacts with a functional group generated as a result of deprotection of the base resin included in the photosensitive organic film, and thereby reduces the polarity of the base resin may be used. For example, the treatment agent may be a derivative of a metal including a metalloid such as silicon. Examples of metals in the metal derivative include aluminum (Al), zirconium (Zr), titanium (Ti), hafnium (Hf), and silicon (Si). Examples of metal derivatives include a metal alkoxide, a metal acylate, a metal chelate, and any combination of the metal alkoxide, the metal acylate, and the metal chelate. The silicon derivative is, for example, alkoxysilane, dialkylaminosilane, or both of them. Examples of titanium derivatives include titanium tetraiisopropoxide ($Ti(O-i-C_3H_7)_4$). Examples of silicon derivatives include N-(trimethylsilyl)dimethylamine (TMSDMA).

The type of the treatment agent may be selected based on the type of a substance infiltrated into the photosensitive organic film and the composition of the photosensitive organic film itself. Because how readily the treatment agent can infiltrate into the photosensitive organic film varies depending on, for example, the solubility of the treatment agent in the photosensitive organic film, the treatment agent is preferably selected according to the amount of the substance to be infiltrated into the photosensitive organic film.

Methods of forming a mask according to embodiments of the present invention are described above. However, the present invention is not limited to the specifically disclosed embodiments, and variations and modifications may be made without departing from the scope of the present invention.

What is claimed is:

1. A method of forming a mask, the method comprising:
    forming a base film containing a treatment agent on an object to be processed;
    forming a photosensitive organic film on the base film;
    forming a infiltrated portion by infiltrating the treatment agent into a lower portion of the photosensitive organic film;
    causing a first region of the photosensitive organic film to be exposed to light while preventing a second region of the photosensitive organic film from being exposed to light, so that the first region is soluble in an alkaline solution and the second region is insoluble in the alkaline solution;
    forming a third region insoluble in the alkaline solution in the infiltrated portion in the first region by causing a reaction between the first region and the treatment agent infiltrated at the lower portion of the photosensitive organic film:
    developing the photosensitive organic film using the alkaline solution to remove a fourth region that is in the first region and other than the third region while leaving intact the second region and the third region; and
    etching the photosensitive organic film to remove one of the second region and the third region while leaving intact another one of the second region and the third region.

2. The method as claimed in claim 1, wherein the forming of the base film includes
    forming a first film on the object, and
    infiltrating the treatment agent into the first film.

3. The method as claimed in claim 1, wherein the photosensitive organic film has a thickness between 50 nm and 100 nm.

4. The method as claimed in claim 1, wherein the photosensitive organic film is selectively exposed by irradiating the photosensitive organic film with extreme ultraviolet light.

5. The method as claimed in claim 1, wherein the photosensitive organic film is etched such that an etching rate of the second region is lower than an etching rate of the third region.

6. The method as claimed in claim 1, wherein the photosensitive organic film is etched such that an etching rate of the second region is higher than an etching rate of the third region.

7. The method as claimed in claim 1, wherein
    the infiltrated portion is formed before selectively exposing the photosensitive organic film; and
    the infiltrated portion is formed while forming the photosensitive organic film.

8. The method as claimed in claim 1, wherein
    the infiltrated portion is formed after selectively exposing the photosensitive organic film; and
    the third region is formed while forming the infiltrated portion in the first region.

9. The method as claimed in claim 1, wherein the base film includes a metal derivative as the treatment agent.

10. The method as claimed in claim 9, wherein the metal derivative is a metal alkoxide, a metal acylate, a metal chelate, or any combination of the metal alkoxide, the metal acylate, and the metal chelate.

11. The method as claimed in claim 9, wherein
    the metal derivative is a silicon derivative; and
    the silicon derivative is alkoxysilane, dialkylaminosilane, or both of alkoxysilane and dialkylaminosilane.

12. The method as claimed in claim 1, wherein the reaction including reacting with a carboxyl group in the first region.

13. A method of forming a mask, the method comprising:
    forming a base film containing a treatment agent on an object to be processed;
    forming a photosensitive organic film on the base film;

forming an infiltrated portion by infiltrating the treatment agent into a lower portion of the photosensitive organic film;

preventing a first region of the photosensitive organic film from being exposed to light while causing a second region of the photosensitive organic film to be exposed to light, so that the first region is soluble in an alkaline solution and the second region is insoluble in the alkaline solution;

forming a third region insoluble in the alkaline solution in the infiltrated portion in the first region by causing a reaction between the first region and the treatment agent infiltrated at the lower portion of the photosensitive organic film;

developing the photosensitive organic film using the alkaline solution to remove a fourth region that is in the first region and other than the third region while leaving intact the second region and the third region; and etching the photosensitive organic film to remove one of the second region and the third region while leaving intact another one of the second region and the third region.

* * * * *